(12) United States Patent
Askan

(10) Patent No.: US 10,971,924 B2
(45) Date of Patent: Apr. 6, 2021

(54) LOW-VOLTAGE PROTECTIVE SWITCHING DEVICE

(71) Applicant: Eaton Intelligent Power Limited, Dublin (IE)

(72) Inventor: Kenan Askan, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 178 days.

(21) Appl. No.: 16/255,865

(22) Filed: Jan. 24, 2019

(65) Prior Publication Data
US 2019/0229525 A1    Jul. 25, 2019

(30) Foreign Application Priority Data
Jan. 25, 2018 (DE) ............... 10 2018 101 677.8

(51) Int. Cl.
*H02H 9/00* (2006.01)
*H01H 9/54* (2006.01)
(Continued)

(52) U.S. Cl.
CPC ........... *H02H 9/001* (2013.01); *H01H 9/542* (2013.01); *H02H 3/025* (2013.01); *H03K 17/164* (2013.01);
(Continued)

(58) Field of Classification Search
CPC ........ H02H 9/001; H02H 9/542; H02H 9/541; H02H 9/547; H02H 3/025; H01H 2009/543; H01H 2009/544
See application file for complete search history.

(56) References Cited

U.S. PATENT DOCUMENTS

| 2007/0121257 A1 | 5/2007 | Maitra et al. |
| 2016/0203932 A1* | 7/2016 | Niehoff ............... H02H 3/025 361/170 |

(Continued)

FOREIGN PATENT DOCUMENTS

| DE | 102015120670 A1 | 6/2017 |
| DE | 102016106414 A1 | 10/2017 |

(Continued)

*Primary Examiner* — Kyle J Moody
*Assistant Examiner* — Jye-June Lee
(74) *Attorney, Agent, or Firm* — Leydig, Voit & Mayer, Ltd.

(57) ABSTRACT

A low-voltage protective switching device includes: at least one line conductor length extending from a line conductor supply connection of the low-voltage protective switching device to a line conductor load connection of the low-voltage protective switching device; a neutral conductor length extending from a neutral conductor connection of the low-voltage protective switching device to a neutral conductor load connection of the low-voltage protective switching device; a mechanical bypass switch and a first mechanical circuit breaker disposed in series in the line conductor length; a second mechanical circuit breaker disposed in the neutral conductor length; a first semiconductor switching arrangement disposed in parallel to the bypass switch; and an electronic control unit that presettably actuates the bypass switch, the first mechanical circuit breaker, the second mechanical circuit breaker, and the first semiconductor switching arrangement. The first semiconductor switching arrangement includes a snubber, which includes a first capacitor.

9 Claims, 1 Drawing Sheet

(51) Int. Cl.
*H02H 3/02* (2006.01)
*H03K 17/16* (2006.01)
(52) U.S. Cl.
CPC . *H01H 2009/543* (2013.01); *H01H 2009/544* (2013.01)

(56) References Cited

U.S. PATENT DOCUMENTS

2018/0261412 A1    9/2018  Schaper et al.
2019/0229529 A1*  7/2019  Askan .................... H01H 9/542

FOREIGN PATENT DOCUMENTS

| | | | | |
|---|---|---|---|---|
| EP | 2320535 A1 | | 5/2011 | |
| KR | 20120137385 A | * | 12/2012 | ............. H01H 9/547 |
| WO | WO-2013071980 A1 | * | 5/2013 | ............. H01H 9/541 |
| WO | WO 2015028634 A1 | | 3/2015 | |
| WO | WO-2018046632 A1 | * | 3/2018 | ............. H01H 9/542 |
| WO | WO-2018046709 A1 | * | 3/2018 | ............. H01H 9/542 |

\* cited by examiner

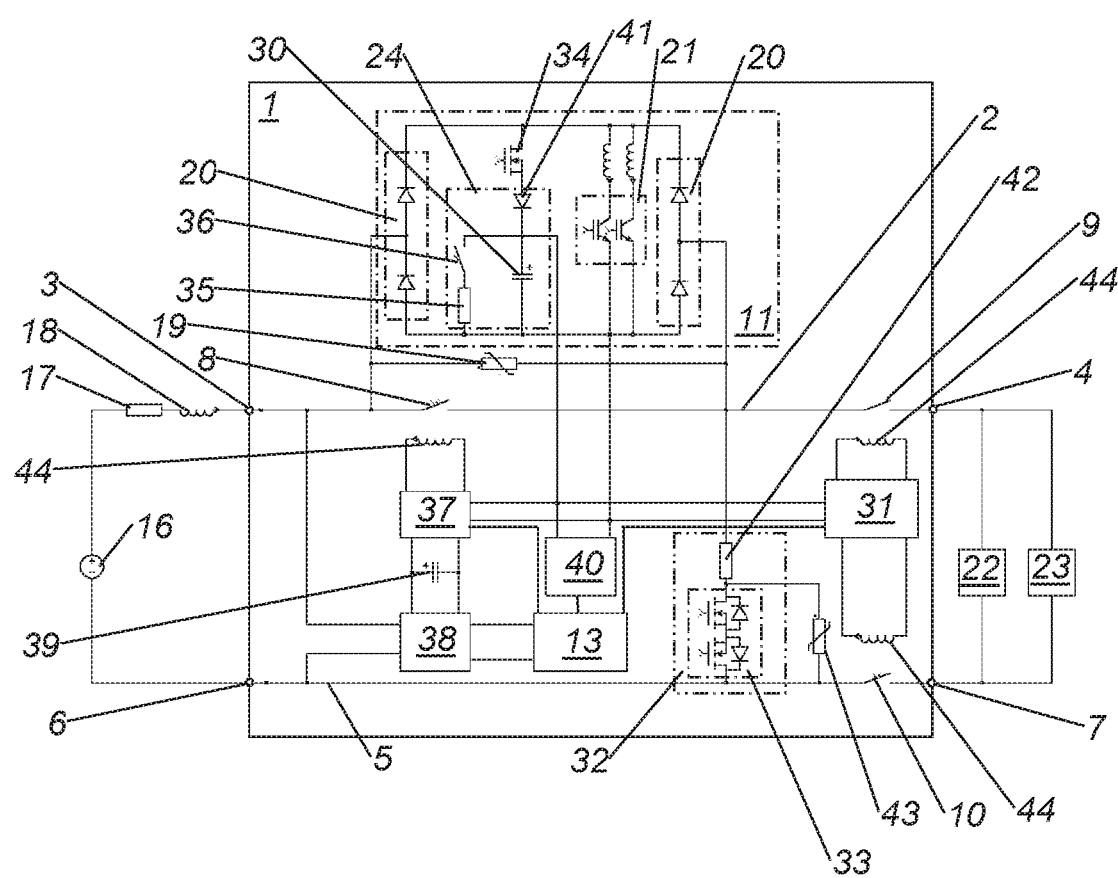

LOW-VOLTAGE PROTECTIVE SWITCHING DEVICE

CROSS-REFERENCE TO PRIOR APPLICATION

Priority is claimed to German Patent Application No. DE 10 2018 101 677.8, filed on Jan. 25, 2018, the entire disclosure of which is hereby incorporated by reference herein.

FIELD

The invention relates to a low-voltage protective switching device.

BACKGROUND

So-called hybrid switching devices that include mechanical switching contacts as well as semiconductor switches are known in the art. Aside from components that are required for the actual deactivation function, these switches further include mechanical circuit breakers intended to achieve galvanic isolation, when the switching device is in the deactivated state, as required in many countries and/or pursuant to pertinent regulations.

Hybrid switching devices typically include at last one capacitor that is typically arranged in a so-called snubber circuit. After such a hybrid switching device has been deactivated, said capacitor is discharged, which is known in the art, via a resistor, whereby the stored energy and/or charge is converted to heat.

When such a switching device is activated, all the mechanical circuit breakers that are used to achieve the galvanic isolation are closed first. With the first electrically conductive contact of these switching contacts of these circuit breakers, the capacitor begins charging, accordingly drawing a charging current. However, when the switching contacts of the circuit breakers are closed, switching contact bouncing ensues, which causes consecutive, brief interruptions of the electrical contact. As current is already being drawn via these switching contacts, any bouncing of the switching contacts results in a series of light arcs and associated contact erosion. This effect is intensified because, while charging, a discharged capacitor draws the highest current at the beginning. This results in wear of the circuit breaker contacts. Increased resistance of the switching devices is the consequence. As current flows continuously through circuit breakers during the normal operation of the switching device, any wear of the break contacts results in higher self heating of the switching device. The operating life of semiconductor components depends greatly on the ambient temperature, wherefore contact bouncing can reduce the operating life of the switching device. Any failure of the semiconductor switching elements in a hybrid switching device can have serious consequences.

Alternating current applications offer the possibility of mitigating the bouncing effect by providing that the circuit breaker is closed around zero-crossing of the supply voltage, whereby the charging current of the capacitor is reduced during bouncing. Although disadvantageous consequences can be reduced this way, they are not eliminated. In addition, switching and/or securing direct current networks has become increasingly important and has become more and more widespread. Because direct current networks do not have zero-crossings, direct current applications do not provide for the possibility of reducing light arcs by adjusting switching times.

SUMMARY

In an embodiment, the present invention provides a low-voltage protective switching device, comprising: at least one line conductor length extending from a line conductor supply connection of the low-voltage protective switching device to a line conductor load connection of the low-voltage protective switching device; a neutral conductor length extending from a neutral conductor connection of the low-voltage protective switching device to a neutral conductor load connection of the low-voltage protective switching device; a mechanical bypass switch and a first mechanical circuit breaker disposed in series in the line conductor length; a second mechanical circuit breaker disposed in the neutral conductor length; a first semiconductor switching arrangement disposed in parallel to the bypass switch; and an electronic control unit configured to presettably actuate the bypass switch, the first mechanical circuit breaker, the second mechanical circuit breaker, and the first semiconductor switching arrangement, wherein the first semiconductor switching arrangement includes a snubber, which comprises a first capacitor, the first capacitor being configured as an energy store configured to actuate the first circuit breaker and the second circuit breaker, the first capacitor being connected via a switching device to a first actuating arrangement of the first circuit breaker and the second circuit breaker.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 1 is a schematic representation of a preferred embodiment of a subject low-voltage protective switching device.

DETAILED DESCRIPTION

In an embodiment, the present invention provides a low-voltage protective switching device of the kind as referred to in the introduction that can avoid the above-mentioned disadvantages while offering low self-heating and a longer operating life.

This way, it is possible to close the break contacts without electrical arcing. This way, it is further possible to achieve that even repeated switching of the low-voltage protective switching device will not age a switch contact due to contact erosion. This way, it is also possible to avoid that self-heating of the low-voltage protective device will increase over time. This way, finally, it is possible to extend the operating life of the now-voltage protective switching device.

Moreover, this way, it is possible to forego the use of a varistor, provided the individual components are dimensioned accordingly. Such electrical energy that is stored, for example, in the different components and leakage inductance can be used to charge the first capacitor during a deactivation process. A varistor will otherwise convert this energy to heat and said heat must be discharged from the low-voltage switching device.

FIG. 1 shows a low-voltage protective switching device 1 with at least one line conductor length 2 from a line conductor supply connection 3 of the low-voltage protective device 1 to a line conductor load connection 4 of the low-voltage protective switching device 1 and a neutral conductor length 5 from a neutral conductor connection 6 of the low-voltage protective switching device 1 to a neutral conductor load connection 7 of the low-voltage protective switching device 1, wherein a mechanical bypass switch 8 and a first mechanical circuit breaker 9 are disposed in series in the line conductor length 2, wherein a second mechanical circuit breaker 10 is disposed in the neutral conductor length 5, wherein a first semiconductor switching arrangement 11 of the low-voltage protective switching device 1 is disposed in parallel to the bypass switch 8, wherein an electronic control unit 13 of the low-voltage protective switching device 1 is configured to presettably actuate the bypass switch 8, the first mechanical circuit breaker 9, the second mechanical circuit breaker 10 and the first semiconductor switching arrangement 11, wherein the first semiconductor switching arrangement 11 includes a snubber 24, which comprises a first capacitor 30, wherein the first capacitor 30 is configured as an energy store for actuating the first circuit breaker 9 and the second circuit breaker 10, and wherein the first capacitor 30 is connected via a switching device to a first actuation arrangement 31 of the first circuit breaker 9 and the second circuit breaker 10.

This way, it is possible to close the circuit breakers 9, 10 without electrical arcing. Moreover, it is possible to achieve that even repeated switching of the low voltage protective switching device 1 will not age the switching contacts due to contact erosion. It is further possible to avoid increased self-heating of the low-voltage protective device 1 over time. Accordingly, it is possible to extend the operating life of the now-voltage protective switching device 1.

Moreover, this way, it is possible to forego the use of a varistor 19 provided the individual components are dimensioned accordingly. Such electrical energy that is stored, for example, in the different components and leakage inductances can be used during the deactivation process to charge the first capacitor 30. Otherwise, a varistor 19 converts this energy to heat, and said heat must be discharged from the low-voltage switching device 1.

This subject low-voltage protective device 1 as well as the protective switching device according to specification WO 2015/028634 A1 are low-voltage protective devices. Low-voltage usually refers to the voltages in the range of up to 1000V alternating current or 1500V direct current, respectively.

FIG. 1 shows a low-voltage protective switching device 1 according to a preferred embodiment. Said embodiment includes a line conductor length 2 and a neutral conductor length 5. The line conductor length 2 extends through the protective switching device 1, coming from a line conductor supply connection 3 and extending to a line conductor load connection 4. The neutral conductor length 5 extends through the protective switching device 1, coming from a neutral conductor connection 6 and extending to a neutral conductor load connection 7. The related connections 3, 4, 6, 7 are each preferably configured as screw-type connection terminals or plug-type connection terminals and disposed in each protective switching device 1 with accessibility from the outside.

The configuration of the circuit with its individual components and the corresponding connections that are achieved via a switching device according to FIG. 1 are part of the description.

Preferably, the protective switching device 1 includes a housing made of an insulating material.

A bypass switch 8 is disposed in the line conductor length 2. A first mechanical circuit breaker 9 is disposed in the line conductor length 2, arranged in series relative to the bypass switch 8. A second mechanical circuit breaker 10 is disposed in the neutral conductor length 5. A semiconductor circuit arrangement 11 is disposed is parallel relative to the bypass switch 8.

The low-voltage protective device 1 furthermore includes a current measurement apparatus disposed in the line conductor length 2 and that is preferably configured as comprising a shunt resistor. The current measurement apparatus is connected to an electronic control unit 13 of the low-voltage protective switching device 1 that is preferably configured comprising a microcontroller and/or a microprocessor.

The electronic control unit 13 is configured to trigger the bypass switch 8 and the first semiconductor switching arrangement 11, as well as the first mechanical circuit breaker 9 and the second mechanical circuit breaker 10, and it can therefore presettably actuate and/or switch the same. To this end, the electronic control unit 13 is connected to the first semiconductor switching arrangement 11 and, furthermore, particularly to the electromagnetic actuating elements of the first mechanical circuit breaker 9 and the second mechanical circuit breaker 10, preferably via a switching device. FIG. 1 also marks a relay coil 44 for the first and second circuit breakers 9, 10, which is connected to a first actuating arrangement 31. The first actuating arrangement 31 therein includes the drive circuit that may be necessary for triggering the relay coils 44.

Accordingly, the control unit 13 is furthermore connected to a second actuating means 37 that includes the corresponding drive circuit for the bypass switch 8 and that is connected to a further relay coil 44, which is allocated to the bypass switch 8. The second capacitor 39, which is connected to the power supply 38, serves as energy source for switching the bypass switch 8. The corresponding connections that start from the electronic control unit 13 are depicted in FIG. 1.

The first semiconductor switching arrangement 11 preferably includes a rectifier circuit 20 that is preferably configured as a full bridge, and, in the subject embodiment, two power semi-conductor devices 21 that are configured as IGBT in this context by way of switching and/or control elements. Envisioning only a single power semi-conductor device 21 is also possible.

Aside from the actual low-voltage protective switching device 1, FIG. 1 hints at the electrical environment. The supply network therein is depicted by the AC/DC power supply 16, the internal line resistance 17 and the supply network inductance 18. Also depicted is an electrical load 23, as well as an electrical error 22 in form of a short.

It is envisioned in a low-voltage switching device 1, as shown in FIG. 1, that a deactivation process is executed by the bypass switch 8 and the first semiconductor switching arrangement 11; the first and second circuit breakers 9, 10 only serve to ensure the galvanic separation of the load circuit after the deactivation is complete.

The first semiconductor switching arrangement 11 further includes a snubber 24. The snubber 24 therein is a common designation in the field of electronics engineering and refers to a damping means. The snubber 24 includes at least one first capacitor 30. It is envisioned that the first capacitor 30 is used as an energy store for actuating the first circuit breaker 9 and the second circuit breaker 10. To this end, the first capacitor 30 is connected via a switching device to the first actuating arrangement 31 of the first circuit breaker 9 and the second circuit breaker 10. It is understood that a parallel circuit of a plurality of discrete capacitors can form a first capacitor 30.

If the first capacitor 30 has sufficiently large dimensions, the first voltage-dependent resistor 19 can be omitted. This is particularly advantageous because, on the one hand, it is possible to omit a component with a large construction footprint; and, on the other hand, it is possible to omit a component whose characteristics are negatively impacted during the usage of the low-voltage protective device 1.

The first capacitor 30 can be charged by means of the energy that is available in the switching means during the deactivation process. However, to ensure an adequate charge of the first capacitor 30 for all eventualities, it is preferably envisioned for the low-voltage protective switching device 1 to include a charging circuit 32 for charging the first capacitor 30 in a manner that can be preset.

The charging circuit 32 preferably includes a second semiconductor switching arrangement 33 that is triggered by the control unit 13 and preferably configured as a bidirectional four-quadrant switch.

When the second semiconductor switching arrangement 33 is in the interconnected state, and when the bypass switch 8 is open, the charging circuit 32 connects the first semiconductor arrangement 11 to the line conductor length 2 and the neutral conductor length 5, whereby the first capacitor 30 is charged.

To prevent the capacitor 30 from discharging and/or to be able to precisely control said discharge, preferably, it is envisioned that a third semiconductor switching arrangement 34, which is connected in series relative to the snubber 24, is disposed in the first semiconductor switching arrangement 11. According to a preferred embodiment, the third semiconductor switching arrangement 34 comprises a transistor, particularly a MOSFET, that is serially connected to a blocking diode 41. The third semiconductor switching arrangement 34 is connected, via triggering technology means, to the electronic control unit 13.

Normally, the first capacitor 30 should be fully charged, and any inadvertent discharging should be prevented. Moreover, preferred operating methods have been described in different contexts. To be able to intentionally trigger a current-less state of the low-voltage protective switching device 1, as required for maintenance and service requirements, a further preferred embodiment provides that the snubber 24 has a first resistor 35 that is disposed and/or switched in parallel with the first capacitor 30 and that a discharge switch 36 is disposed in series with the first resistor 35 and in parallel with the first capacitor 30. The first capacitor 30 can be discharged by closing the discharge switch 36; accordingly, the risk of damage to the low-voltage protective switching device 1 or injury to the technician has been prevented.

The preferred method for activating the low-voltage protective switching device 1 will be described below. To this end, it is preferably provided that the correspondingly configured electronic control unit 13 first activates the second semiconductor switching arrangement 33 for the purpose of charging the first capacitor 30, followed, subsequently, by the activation of the third semiconductor 34. The current is now flowing, which is limited by the limiting resistor 42. It is possible to omit the limiting resistor 42, if the second semiconductor arrangement 33 and the third semiconductor arrangement 34 are operated while saturated. Then there is a wait time until the first capacitor 30 has a presettable charge or reaches, respectively, a presettable charge. To this end, the charging state monitoring unit 40 measures the voltage on the first capacitor 30. The first capacitor 30 can, as generally known in the art, be charged to the maximum applied voltage, therefore source voltage.

After reaching the presettable charge of a first capacitor 30, first the second semiconductor switching arrangement 33 is deactivated, followed, subsequently, by the deactivation of the third semiconductor 34. The blocking diode 41 prevents any inadvertent discharge of the first capacitor 30.

Below, the second circuit breaker 10 is closed first, followed by the first circuit breaker 9. This results in the contact bouncing effect as described in the introduction, which occurs, however, free of current and therefore without arcing, because the blocking diode 41 and the third semiconductor switching arrangement 34 block the voltage of the first capacitor 30.

The first semiconductor switching arrangement 11 is activated after the first circuit breaker 9 and the second circuit breaker 10 have reached a stable state, respectively. According to one simple embodiment, to this end, there is a wait time that lasts for a presettable span and that has been determined based on experiments after outputting a corresponding signal for closing the first and second circuit breakers 9, 10. The corresponding energy for activating the first semiconductor switching arrangement 11 is supplied by the power pack 38. As generally known in the art, a current can now flow to a possibly available load.

Provided no excess current or short is detected at this time, the bypass switch 8 is subsequently closed, and the first semiconductor switching arrangement 11 is deactivated. In case of alternating current, the bypass switch 8 is closed in a manner generally known in the art at zero-crossing of the voltage. The corresponding power that is needed for closing the bypass switch 8 is supplied by the first capacitor 30.

The electronic control unit 13 is moreover preferably configured in such a way that, while the low-voltage protective switching device 1 is activated, it will presettably charge the first capacitor 30 in a manner than can be preset by activating the second semiconductor switching arrangement 33 and the third semiconductor switching arrangement 34. This way, it can be ensured that, independently of any other operating influences, the first capacitor 30 has a sufficient charge. Accordingly, even when the supply provides only a small amount of power, the deactivation process is possible.

The process of switching a subject low-voltage protective switching device 1 off substantially follows methods known in the art as described in WO 2015/028634 A1, except for the difference that is described below. Contrary to the above, the charge in the first capacitor 30 is not converted to heat by means of the resistors; said charge is instead used to open the first mechanical circuit breaker 9 and the second mechanic circuit breaker 10, as soon as the current is substantially zero. If the first capacitor 30 has sufficiently large dimensions, it is possible to omit the varistor 19. This also helps with avoiding problems associated with an aging varistor that may otherwise occur.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A low-voltage protective switching device, comprising:
   at least one line conductor length extending from a line conductor supply connection of the low-voltage protective switching device to a line conductor load connection of the low-voltage protective switching device;
   a neutral conductor length extending from a neutral conductor connection of the low-voltage protective switching device to a neutral conductor load connection of the low-voltage protective switching device;
   a mechanical bypass switch and a first mechanical circuit breaker disposed in series in the at least one line conductor length;
   a second mechanical circuit breaker disposed in the neutral conductor length;
   a first semiconductor switching arrangement disposed in parallel to the mechanical bypass switch; and
   an electronic control unit configured to presettably actuate the mechanical bypass switch, the first mechanical circuit breaker, the second mechanical circuit breaker, and the first semiconductor switching arrangement,
   wherein the first semiconductor switching arrangement includes a snubber, which comprises a first capacitor, the first capacitor being configured as an energy store configured to actuate the first mechanical circuit breaker and the second mechanical circuit breaker, the first capacitor being connected via a switching device to a first actuating arrangement of the first mechanical circuit breaker and the second mechanical circuit breaker.

2. The low-voltage protective switching device according to claim 1, wherein the low-voltage protective switching device includes a charging circuit configured to presettably charge the first capacitor.

3. The low-voltage protective switching device according to claim 2, wherein the charging circuit includes a second semiconductor switching arrangement that is triggerable by the electronic control unit.

4. The low-voltage protective switching device according to claim 3, wherein the second semiconductor switching arrangement comprises a bidirectional four-quadrant switch.

5. The low-voltage protective switching device according to claim 3, wherein the charging circuit connects, when in an interconnected state of the second semiconductor switching arrangement and when the mechanical bypass switch is open, the first semiconductor switching arrangement to the at least one line conductor length and the neutral conductor length.

6. The low-voltage protective switching device according to claim 1, further comprising a third semiconductor switching arrangement disposed in the first semiconductor switching arrangement, the third semiconductor switching arrangement being connected in series to the snubber.

7. The low-voltage protective switching device according to claim 6, wherein, upon activating the low-voltage protective switching device, the electronic control unit is configured to first activate the second semiconductor switching arrangement, then the third semiconductor switching arrangement, followed by first closing the second mechanical circuit breaker and subsequently the first mechanical circuit breaker after a presettable charge of the first capacitor has been reached, followed by activating the first semiconductor switching arrangement after a stable state of the first mechanical circuit breaker and the second mechanical circuit breaker has been reached, then closing the mechanical bypass switch and deactivating the first semiconductor switching arrangement.

8. The low-voltage protective switching device according to claim 6, wherein the electronic control unit is configured such that, when the low-voltage protective switching device is activated, the electronic control unit will presettably charge the first capacitor by presettably activating the second semiconductor switching arrangement and the third semiconductor switching arrangement.

9. The low-voltage protective switching device according to claim 1, wherein the snubber has a first resistor that is disposed parallel relative to the first capacitor, and
   wherein a discharge switch is disposed in series relative to the first resistor and in parallel relative to the first capacitor.

* * * * *